(12) United States Patent
Kurita

(10) Patent No.: US 10,373,929 B2
(45) Date of Patent: Aug. 6, 2019

(54) METHOD OF MANUFACTURING A SEMICONDUCTOR DEVICE

(71) Applicant: Toshiba Memory Corporation, Tokyo (JP)

(72) Inventor: Yoichiro Kurita, Minato Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/905,570

(22) Filed: Feb. 26, 2018

(65) Prior Publication Data

US 2019/0088619 A1   Mar. 21, 2019

(30) Foreign Application Priority Data

Sep. 15, 2017   (JP) ................ 2017-178297

(51) Int. Cl.
| | |
|---|---|
| *H01L 23/00* | (2006.01) |
| *H01L 23/538* | (2006.01) |
| *H01L 25/065* | (2006.01) |
| *H01L 21/56* | (2006.01) |
| *H01L 21/02* | (2006.01) |

(52) U.S. Cl.
CPC ........ *H01L 24/97* (2013.01); *H01L 21/02107* (2013.01); *H01L 21/568* (2013.01); *H01L 23/5389* (2013.01); *H01L 24/11* (2013.01); *H01L 24/49* (2013.01); *H01L 24/96* (2013.01); *H01L 25/0657* (2013.01); *H01L 2225/1058* (2013.01); *H01L 2924/01029* (2013.01); *H01L 2924/14* (2013.01)

(58) Field of Classification Search
CPC ..... H01L 24/97; H01L 24/49; H01L 23/5389; H01L 24/11; H01L 25/0657; H01L 21/568; H01L 24/96; H01L 21/02107; H01L 2924/14; H01L 2924/01029; H01L 2225/1058

See application file for complete search history.

(56) References Cited

U.S. PATENT DOCUMENTS

| | | | | |
|---|---|---|---|---|
| 2007/0158837 A1* | 7/2007 | Kurita | ................. | H01L 21/563 257/734 |
| 2018/0012774 A1* | 1/2018 | Hu | ................. | H01L 21/4853 |

FOREIGN PATENT DOCUMENTS

| | | |
|---|---|---|
| JP | 2015-173169 A | 10/2015 |
| JP | 2016-103625 A | 6/2016 |
| WO | 2010/058646 A1 | 5/2010 |

\* cited by examiner

*Primary Examiner* — Sonya D. McCall-Shepard
(74) *Attorney, Agent, or Firm* — Kim & Stewart LLP

(57) ABSTRACT

A method of manufacturing a semiconductor device includes forming an insulation layer on a support body, selectively forming openings through the insulation layer, forming a conductor pattern in the openings, and above selected portions of, the insulation layer, mounting a first semiconductor element on the insulation layer and electrically connecting the first semiconductor element to the conductor pattern, forming a resin over the first semiconductor element and the insulation layer, removing the support body after the resin is formed to expose a surface of a portion of the conductor pattern, etching the exposed surface of the portion of the conductor pattern to form a recess over the portion of the conductor pattern, and forming a pad containing a metal different than the metal of the conductor pattern in the recess in contact with the conductor pattern.

12 Claims, 17 Drawing Sheets

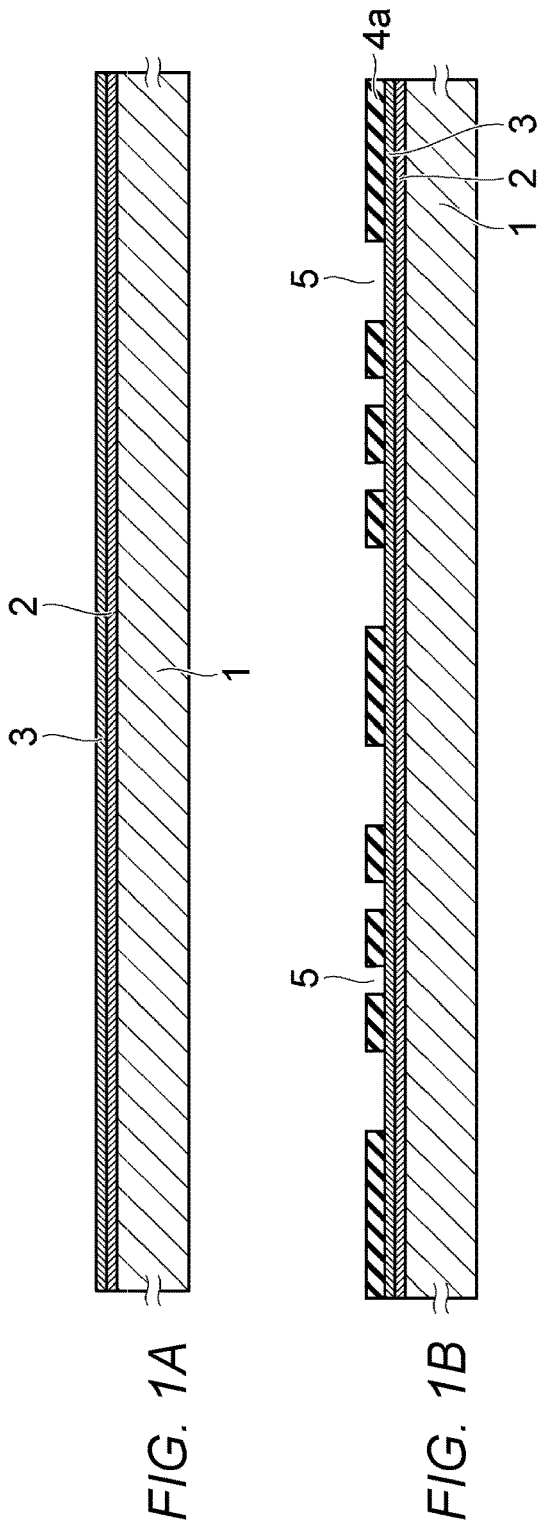

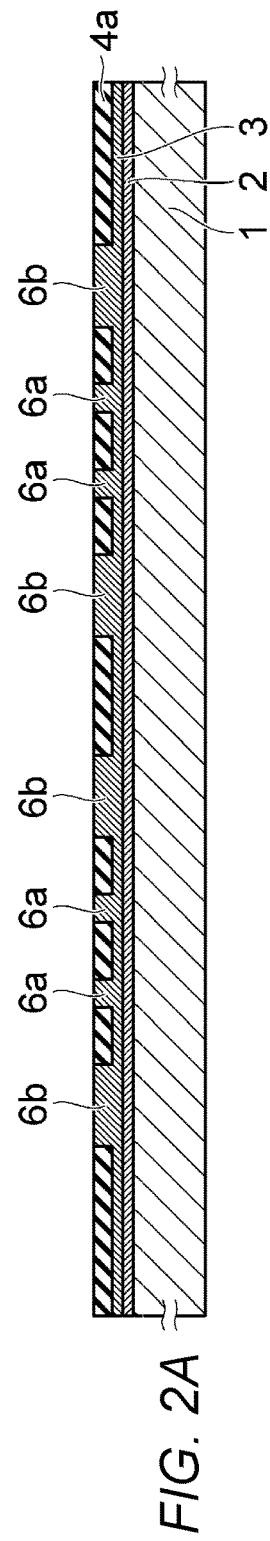
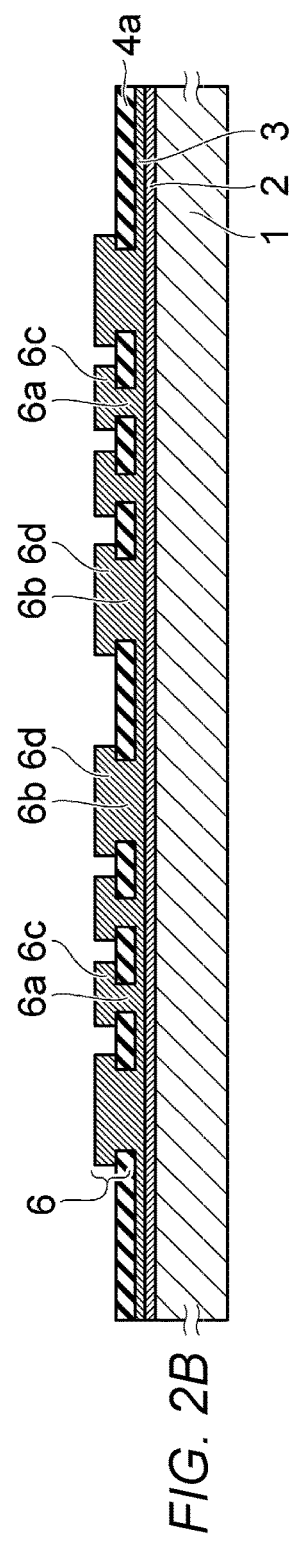
FIG. 2A
FIG. 2B

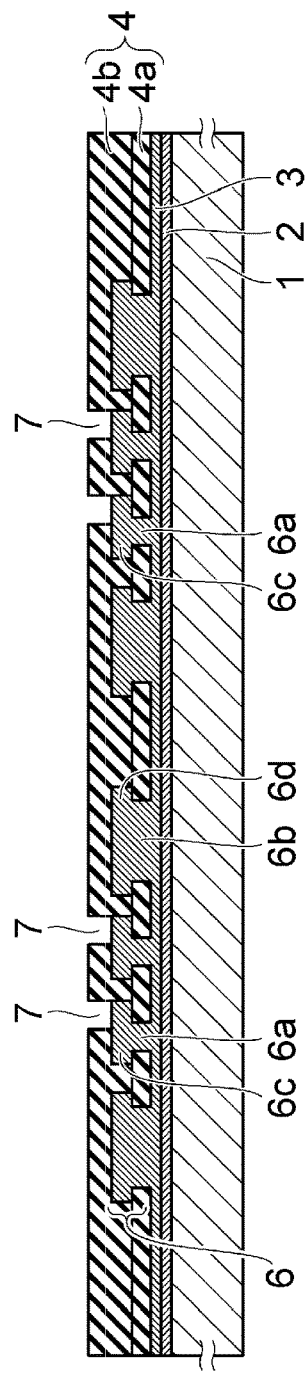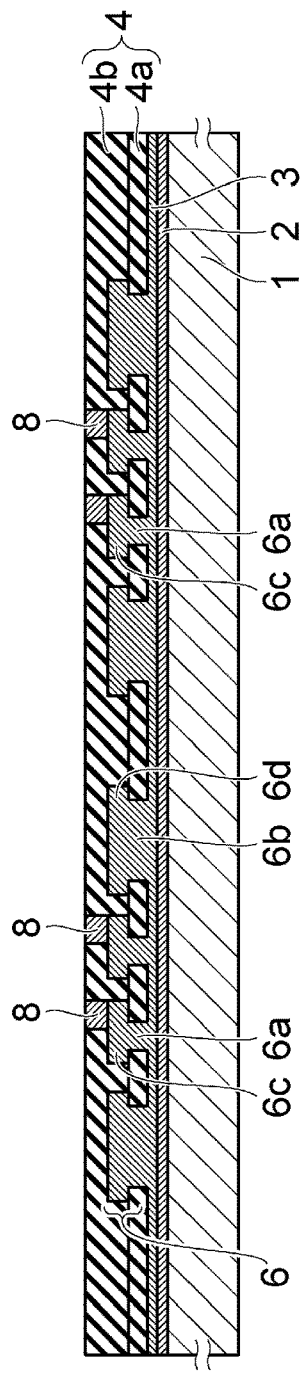

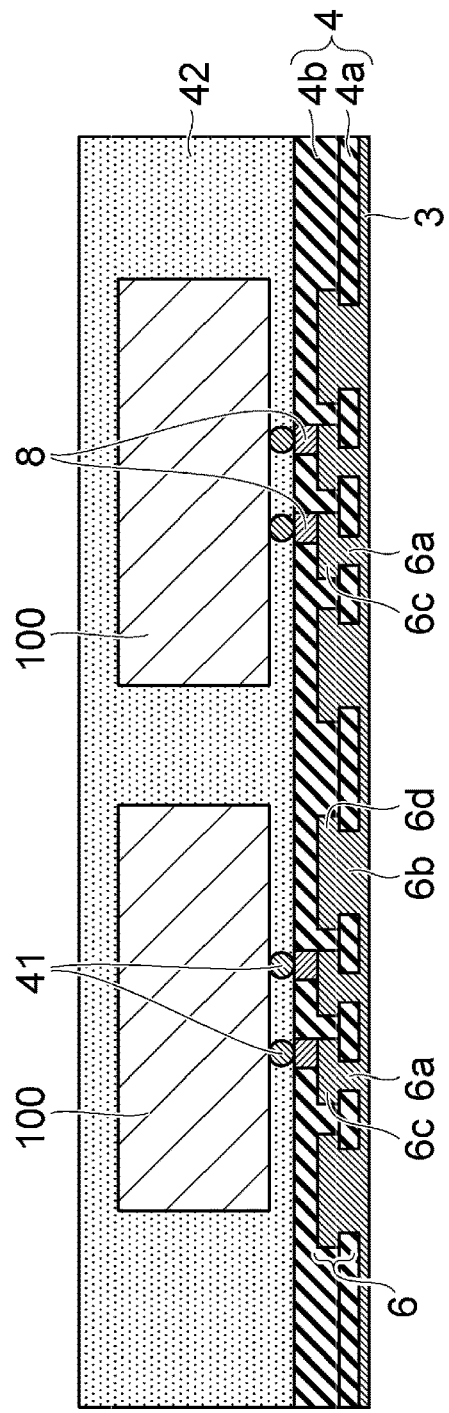
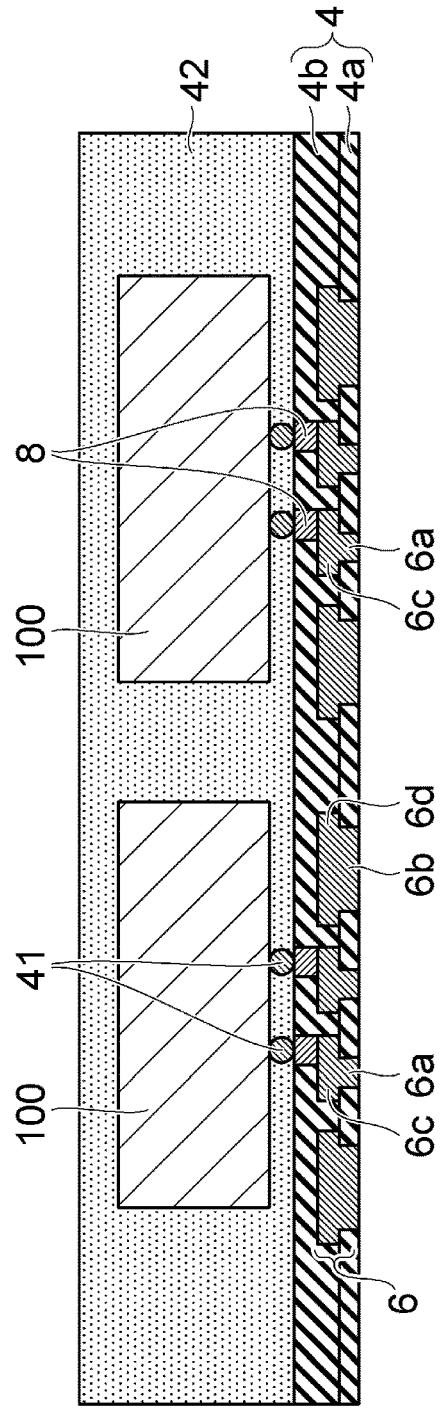
FIG. 5A
FIG. 5B

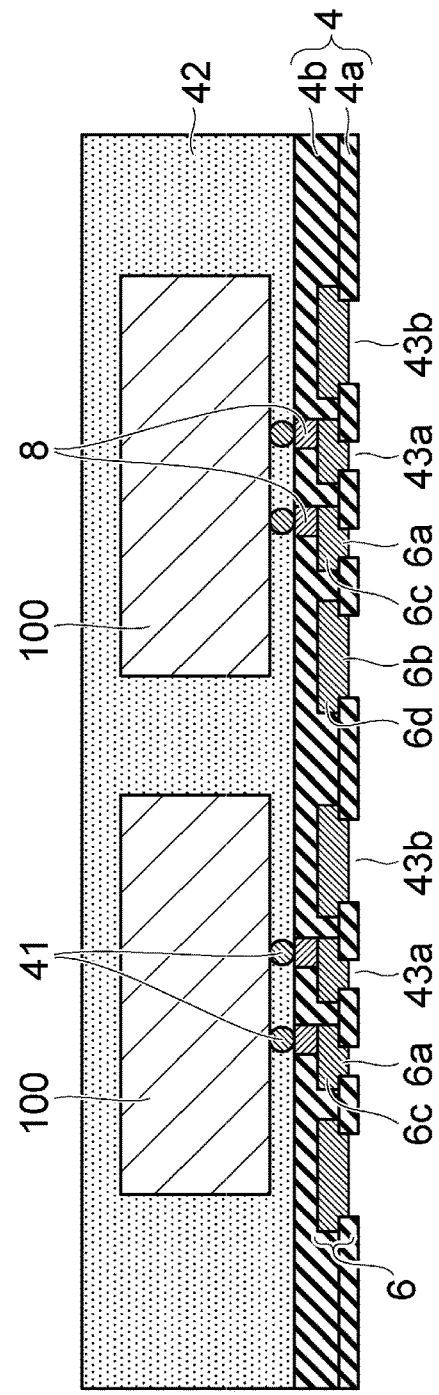
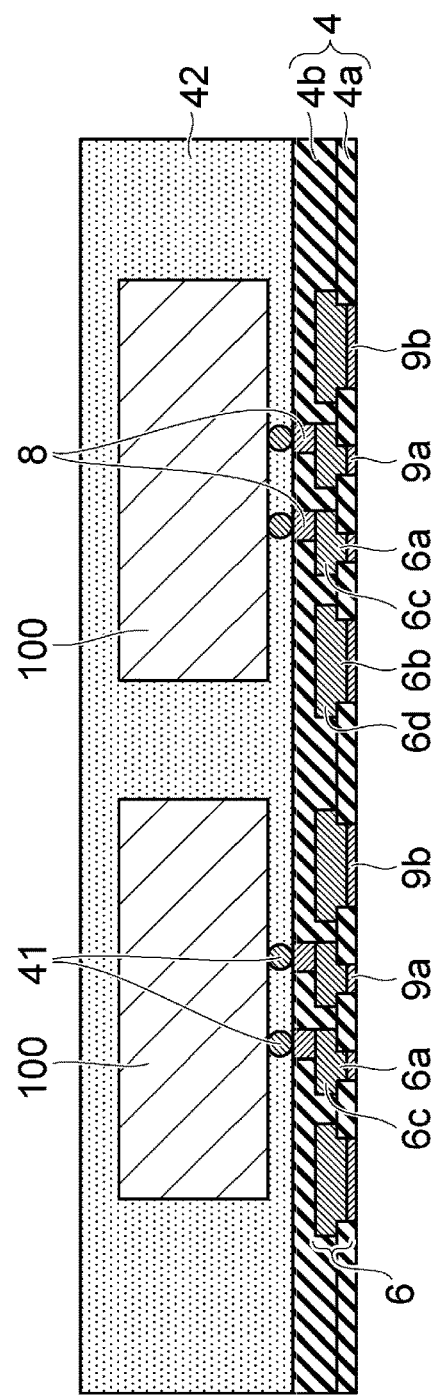
FIG. 6A
FIG. 6B

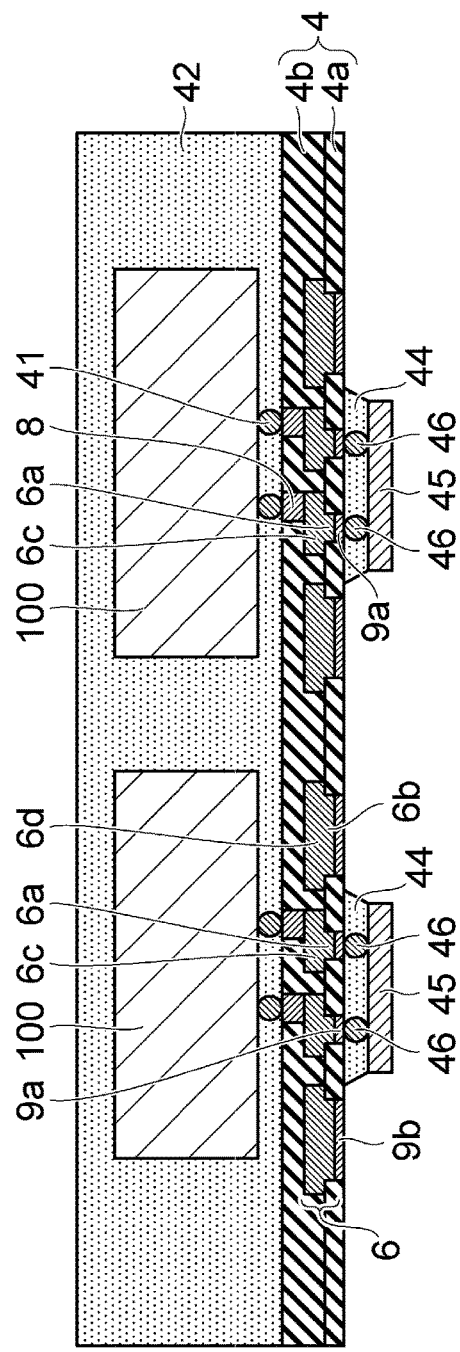
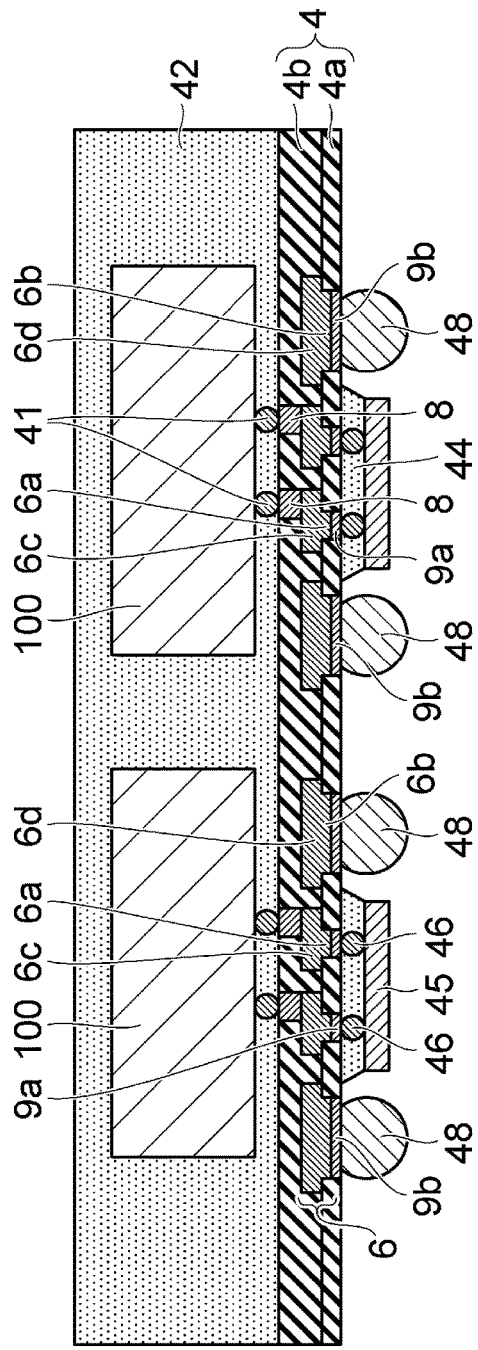
FIG. 7A
FIG. 7B

METHOD OF MANUFACTURING A SEMICONDUCTOR DEVICE

CROSS-REFERENCE TO RELATED APPLICATION

This application is based upon and claims the benefit of priority from. Japanese Patent Application No. 2017-178297, filed Sep. 15, 2017, the entire contents of which are incorporated herein by reference.

FIELD

Embodiments described herein relate generally to a method of manufacturing a semiconductor device.

BACKGROUND

If a semiconductor chip is microbump-bonded to a rear surface side of an interposer on which another semiconductor chip is mounted, the interposer is required to have a microbump connecting pad with a narrow pitch.

DESCRIPTION OF THE DRAWINGS

FIGS. 1A and 1B are schematic sectional views illustrating a method of manufacturing a semiconductor device according to an embodiment.

FIGS. 2A and 2B are schematic sectional views illustrating the method of manufacturing the semiconductor device according to the embodiment.

FIGS. 3A and 3B are schematic sectional views illustrating the method of manufacturing the semiconductor device according to the embodiment.

FIGS. 5A and 5B are schematic sectional views illustrating the method of manufacturing the semiconductor device according to the embodiment.

FIGS. 6A and 6B are schematic sectional views illustrating the method of manufacturing the semiconductor device according to the embodiment.

FIGS. 7A and 7B are schematic sectional views illustrating the method of manufacturing the semiconductor device according to the embodiment.

DETAILED DESCRIPTION

Figure 4A:
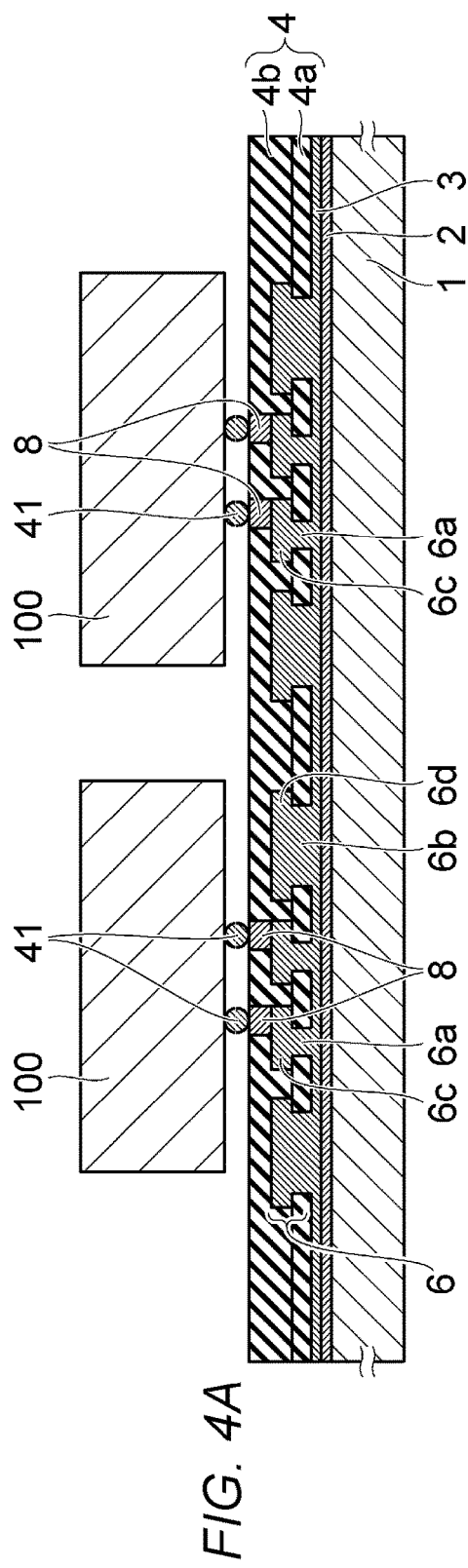
FIGS. 4A and 4B are schematic sectional views illustrating the method of manufacturing the semiconductor device according to the embodiment.

Embodiments provide a method of manufacturing a semiconductor device that can enhance bonding stability of a device having bumps arrayed at a narrow pitch.

In general, according to one embodiment, a method of manufacturing a semiconductor device includes forming an insulation layer on a support body, selectively forming openings through the insulation layer, forming a conductor pattern in the openings, and above selected portions of, the insulation layer, mounting a first semiconductor element on the insulation layer and electrically connecting the first semiconductor element to the conductor pattern, forming a resin over the first semiconductor element and the insulation layer, removing the support body after the resin is formed to expose a surface of a portion of the conductor pattern, etching the exposed surface of the portion of the conductor pattern to form a recess over the portion of the conductor pattern, and forming a pad containing a metal different than the metal of the conductor pattern in the recess in contact with the conductor pattern.

FIGS. 1A to 8 are schematic sectional views illustrating a method of manufacturing a semiconductor device according to an embodiment.

As illustrated in FIG. 1A, a peeling layer 2 is formed on a support body 1, and a seed layer 3 is formed on the peeling layer 2. The support body 1 is, for example, a silicon substrate or a glass substrate. The peeling layer 2 may be omitted.

The seed layer 3 is, for example, a copper (Cu) film. A titanium (Ti) film may be formed between the copper film and the peeling layer 2 (or the support body 1).

As illustrated in FIG. 1B, an insulation layer 4a is formed on the seed layer 3. The insulation layer 4a is formed of, for example, a resin material. A plurality of openings 5 are formed through the insulation layer 4a. The openings 5 penetrate the insulation layer 4a. The seed layer 3 is exposed at the bottom of the openings 5.

For example, via-shaped conduction portions 6a and 6b are formed in the openings 5 as illustrated in FIG. 2A. For example, copper is grown in a columnar shape on the seed layer 3 exposed at the bottom of the openings 5 by a plating method, and the inside of the openings 5 are filled with copper.

The conduction portions (coppers) formed in the openings 5 include a plurality of first conduction portions 6a and a plurality of second conduction portions 6b. A diameter of the first conduction portion 6a is smaller than a diameter of the second conduction portion 6b. The plurality of first conduction portions 6a are arranged with respect to each other at a narrow pitch of, for example, 40 μm or less.

After the openings 5 are filled with the conduction portions 6a and 6b, copper wiring layers 6c and 6d are further formed on the insulation layer 4a by a plating method as illustrated in FIG. 2B. A first wiring layer 6c is formed on the first conduction portion 6a integrally with the first conduction portion 6a. A second wiring layer 6d is formed on the second conduction portion 6b integrally with the second conduction portion 6b.

As such, a conductor pattern 6 is formed which includes the conduction portions 6a and 6b buried in the insulation layer 4a and the wiring layers 6c and 6d connected to the conduction portions 6a and 6b. The conductor pattern 6 is formed by a plating method which uses the seed layer 3. The conductor pattern 6 contains copper as a main component and is formed of a copper material. Alternatively, the conductor pattern 6 may be configured with a copper alloy material.

After forming the conductor pattern 6, an insulation layer 4b is formed on the insulation layer 4a as illustrated in FIG. 3A. The insulation layer 4b covers the wiring layers 6c and 6d. The insulation layer 4b is formed of, for example, the same resin material as the insulation layer 4a. Hereinafter, the insulation layer 4a and the insulation layer 4b are collectively referred to as an insulation layer 4.

Openings 7 are formed in the insulation layer 4 so as to reach the first wiring layer 6c. The first wiring layer 6c is exposed at the bottom of the openings 7.

The openings 7 are then filled with a material to form pads 8, as illustrated in FIG. 3B. The pads 8 a composed of a metal film formed by, for example, an electroless plating method and are electrically connected to the first wiring layer 6c. For example, a nickel (Ni) film, a palladium (Pd) film, and a gold (Au) film are sequentially formed on the first wiring layer 6c exposed at the bottom of the openings 7 using the electroless plating method.

By the above processes, an interposer having the conductor pattern (including the conduction portions 6a and 6b, the wiring layers 6c and 6d, and the pads 8) and the insulation layer 4 is formed on the support body 1. A first semiconductor element (first semiconductor chip) 100 is next mounted on the interposer as illustrated in FIG. 4A.

The semiconductor element 100 is bump-connected to the pads 8, i.e., solder or other conductive bumps are used to electrically connect the semiconductor element 100 to the interposer. An electrode pad (not illustrated) of the semiconductor element 100 is bonded to the pad 8 of the interposer via, for example, a solder bump 41.

Figure 4B:
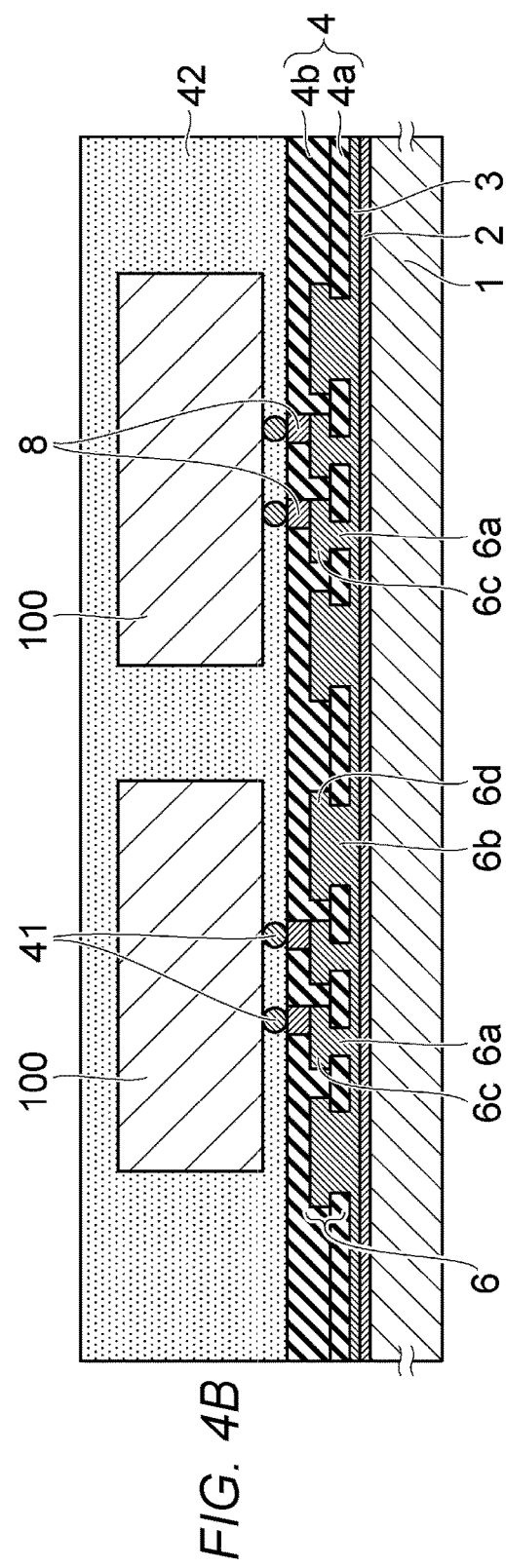

After the semiconductor element 100 is mounted on the interposer, a resin 42 is formed on the interposer as illustrated in FIG. 4B. The resin 42 forms a seal the semiconductor element 100, and the semiconductor element 100 is protected from an external environment.

After the semiconductor element 100 is sealed with the resin 42, the support body 1 is removed. For example, the support body 1 and interposer formed thereon can be easily separated by peeling the support body and the interposer from each other using the peeling layer 2. In addition, for example, a support body 1 which is a silicon substrate can also be removed from the interposer by grinding. In this case, the peeling layer 2 may be omitted.

Once the support body 1 is removed, the seed layer 3 becomes exposed, as illustrated in FIG. 5A. The seed layer 3 is then removed using, for example, wet etching.

The seed layer 3 is removed, and surfaces of the conduction portions 6a and 6b which are a part of the conductor pattern 6 are exposed, as illustrated in FIG. 5B. In addition, a surface of the insulation layer 4 which is on a side of the interposer opposite to the mounting surface receiving the semiconductor element 100 is also exposed.

For example, the exposed surfaces of the conduction portions 6a and 6b formed of copper become recessed or inset due to, for example, wet etching, and recess portions 43a and 43b are formed on the surface of the insulation layer 4, as illustrated in FIG. 6A. The conduction portions 6a and 6b are not completely removed and a part of the conduction portions 6a and 6b is left.

The first conduction portion 6a is recessed to form a recessed portion 43a, the second conduction portion 6b is recessed to forma recessed portion 43b, a surface of the first conduction portion 6a is exposed at the bottom of the recessed portion 43a, and a surface of the second conduction portion 6b is exposed at the bottom of the recessed portion 43b.

As illustrated in FIG. 6B, pads 9a and 9b are formed in the recessed portions 43a and 43b. The recessed portion 43a is filled with a metal material containing at least one of gold and nickel, and a first pad 9a connected to the first conduction portion 6a is formed. The recessed portion 43b is filled with a metal material containing at least one of gold and nickel, and a second pad 9b connected to the second conduction portion 6b is formed. The pads 9a and 9b contain a metal element different from the metal element (copper) contained in the conduction portions 6a and 6b.

The pads 9a and 9b grow from surfaces of the conduction portions 6a and 6b using, for example, an electroless plating method, and are formed on the recessed portions 43a and 43b in a self-aligned manner.

A diameter of the first pad 9a is smaller than a diameter of the second pad 9b. The plurality of first pads 9a are arranged at a narrow pitch of, for example, 40 μm or less.

The pads 9a and 9b are formed to fit within the recessed portions 43a and 43b without protruding above the surface of the insulation layer 4 from the openings in which the recessed portions 43a and 43b are formed. This reliably prevents a short-circuit across the surface of the insulation layer 4a and between the first pads 9a arranged with a narrow pitch in particular.

Processes of forming the pads 9a and 9b include, for example, a process of forming a nickel (Ni) film and a gold (Au) film using an electroless plating method. The nickel film and the gold film sequentially grow on the surfaces of the conduction portions 6a and 6b exposed in the recess portions 43a and 43b. In addition, for example, a palladium (Pd) film may be formed between the nickel film and the gold film as a diffusion preventing barrier film for preventing mutual diffusion of nickel and gold.

Alternatively, the processes of forming the pads 9a and 9b includes a process of forming a nickel film on surfaces of the conduction portions 6a and 6b exposed in the recess portions 43a and 43b using an electroless plating method, and a process of replacing nickel of the nickel film with gold.

Surfaces of the pads 9a and 9b are exposed at openings in the insulation layer 4, and gold is formed on the surfaces of the pads as an oxidation resistant metal superior in oxidation resistance to copper, which is a material of the conductor pattern 6.

A second semiconductor element (second semiconductor chip) 45 is bump-connected to the first pad 9a as illustrated in FIG. 7A. An electrode pad (not illustrated) of the semiconductor element 45 is bonded to the first pad 9a by, for example, a solder bump 46.

A resin 44 is filled between the semiconductor element 45 and the interposer. The resin 44 covers the solder bumps 46. The resin 44 covers a bonding portion between the solder bump 46 and the semiconductor element 45 and a bonding portion between the solder bump 46 and the first pad 9a, and fills the gap between the semiconductor element 45 and the first pad 9a.

As illustrated in FIG. 7B, an external terminal 48 is bonded to the second pad 9b. The external terminal 48 is, for example, a solder bump. In addition, before the external terminal 48 is formed, a wiring layer may be further built up on the mounting surface of the semiconductor element 45 to the interposer. The processes so far are performed in a wafer state.

Figure 8:
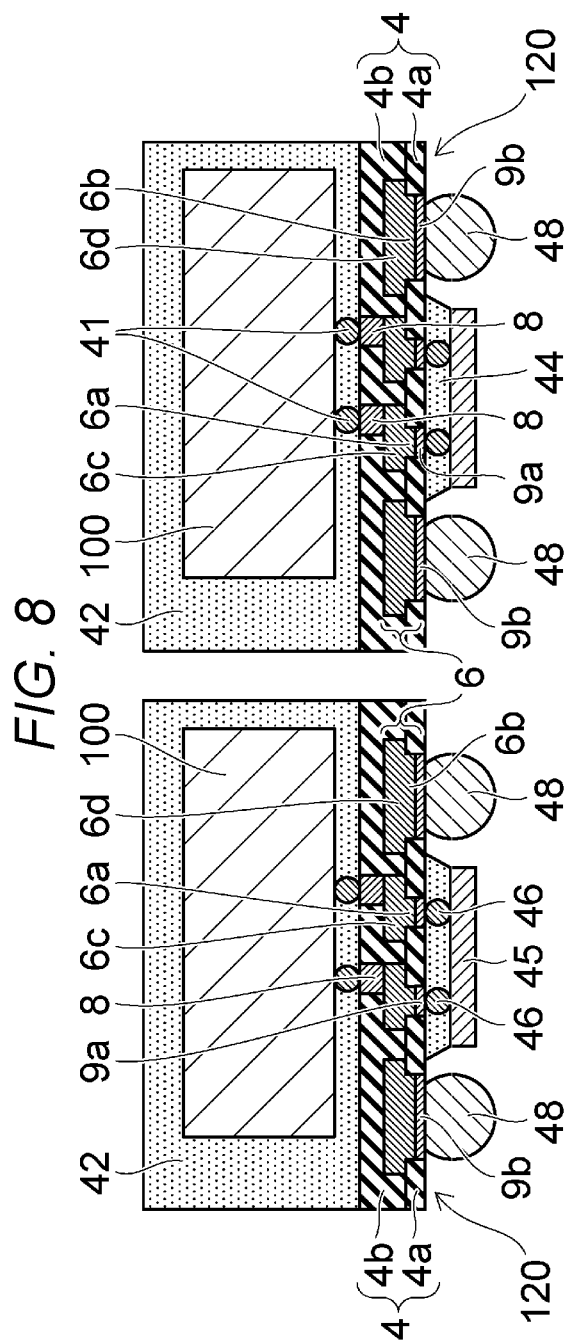
FIG. 8 is a schematic sectional view illustrating the method of manufacturing the semiconductor device according to the embodiment.

Thereafter, the wafer is diced and divided into a plurality of semiconductor devices as illustrated in FIG. 8.

Each semiconductor device may have a configuration in which the first semiconductor element 100 is mounted on one surface of an interposer 120 including the conductor pattern 6, the pads 8, 9a, and 9b, and the insulation layer 4, and the second semiconductor element 45 is mounted on the other surface of the interposer 120. For example, the semiconductor element 100 includes a memory chip, and the semiconductor element 45 is a control chip (or an interface chip) that controls the memory chip 100.

The semiconductor element 100 is electrically connected to the wiring layers 6c and 6d through the bumps 41 and the pads 8. The semiconductor element 45 is electrically connected to the wiring layers 6c and 6d through the bumps 46 and the pads 9a. The semiconductor element 100 and the semiconductor element 45 are electrically connected to each other through the interposer 120. The wiring layers 6c and 6d of the interposer 120 are electrically connected to an external circuit through the pads 9b and the external terminals 48.

During the bonding of solder to a metal pad, flux is generally used to remove an oxide film on a surface of a pad, and the flux is washed away after bonding is performed. However, if flux is used for connecting a microbump with a narrow pitch of, for example, 40 μm or less, removing the flux after bonding may be difficult. If residue of the flux remains between the bumps with a narrow pitch, a void may be generated in a subsequent resin sealing layer.

In contrast to this, according to the embodiment, gold which is an oxidation resistant metal is formed on a surface of the pad 9a with a narrow pitch to which the semiconductor element 45 is bump-connected, and thus, it is possible to connect a solder bump (micro solder bump) 46 to the pad 9a with a narrow pitch without using flux, and thereby enhance bonding stability of the bumps with a narrow pitch.

As a comparative example to this embodiment, it is previously recommended to form a gold film on a bottom surface of the opening 5 of the insulation layer 4a illustrated in FIG. 1B, before the conduction portion 6a illustrated in FIG. 2A is formed. However, in this case, gold may diffuse due to heat treatment during the process and gold may not remain on the surface of the conduction portion 6a exposed in the process illustrated in FIG. 5B. For example, processes of forming the insulation layer 4 include a process of supplying a liquid resin and a process of thermally curing the liquid resin. A temperature at the time of thermal curing the resin is approximately 250° C. to 300° C., and gold may be diffused at this temperature.

In contrast to this, according to the embodiment, after the process accompanying the heat treatment capable of diffusing the gold is completed, the pad 9a is formed on the surface of the conduction portion 6a as illustrated in FIG. 6B. The gold is formed on the surface of the pad 9a, and a solder bump 46 can be bonded to the surface of the pad 9a without using flux in the process of bump-connecting the semiconductor element 45 illustrated in FIG. 7A.

In addition, the film of the conduction portions 6a and 6b formed of a copper film is etched to recess the copper film to form the recess portions 43a and 43b, a gold film is formed in the recess portion 43a and 43b, and thereby the pads 9a and 9b may be formed.

Alternatively, the pads 9a and 9b may be formed by forming a copper film and a nickel film in the recess portion 43a and 43b. In this case, when the bump 46 is bonded to the pad 9a, a surface oxide formed on the pad 9a can be removed by using a non-cleaning flux or formic acid, and the bonding stability of a bumps with a narrow pitch can be enhanced.

In the above-described embodiment, the insulation layer 4 may be formed so as to cover the conductor pattern 6 after the conductor pattern 6 is previously formed on the support body 1.

In addition, the wiring layers 6c and 6d may be multilayer wirings, and the multilayer wirings are connected by vias.

Figure 9A:
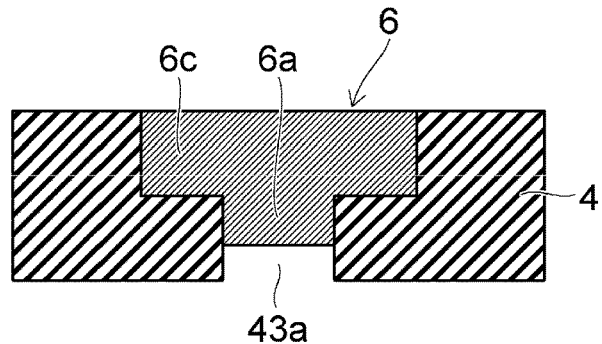
FIGS. 9A to 9C are schematic sectional views illustrating the method of manufacturing the semiconductor device according to the embodiment.
Figure 9B:
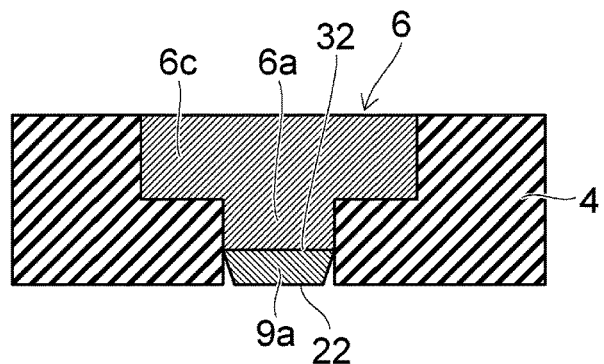
Figure 9C:
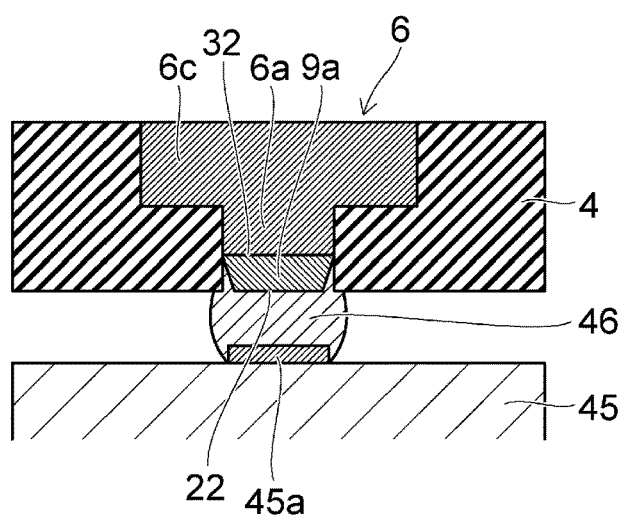

FIGS. 9A to 9C are enlarged views of the bump connection portion for the first conduction portion 6a in the process illustrated in FIGS. 6A to 7A described above.

After a surface of the first conduction portion 6a is recessed to form the recessed portion 43a as illustrated in FIG. 9A, the pad 9a is formed on the recessed portion 43a as illustrated in FIG. 9B.

The pad 9a (plating metal) grows from the surface of the first conduction portion 6a by an electroless plating method. The insulation layer 4 is exposed on a side surface of the recess in the insulation layer 4 over the recessed portion 43a, and the pad 9a (plating metal) does not grow from the side surface of the recess portion 43a.

Thus, a shape of the pad 9a can be approximated to a truncated cone shape having an upper base 22 and a lower base 32. The lower base 32 is located on a front side of the first conduction portion 6a (bottom side of the recess portion 43a), and the upper base 22 is located on an opening side of the recess portion 43a (a side bonded to the solder bump 46).

A diameter of the upper base 22 (width of the upper base 22 in a cross section of FIG. 9B) is smaller than a diameter of the lower base 32 (width of the lower base 32 in the cross section of FIG. 9B), and a gap is formed between a side surface of the pad 9a having a truncated cone shape and a side surface of recess within which the recessed portion 43a is present.

As illustrated in FIG. 9C, a part of the solder bump 46 connecting the pad 9a to the electrode pad 45a of the semiconductor element 45 fills into the gap between the side surface of the pad 9a and the side surface of the recess, and the solder bump 46 is also in contact with the side surface of the recess and the upper base 22 of the pad 9a. This increases the bonding strength between the pad 9a and the solder bump 46, and further reduces the contact resistance between the pad 9a and the solder bump 46.

Figure 10A:
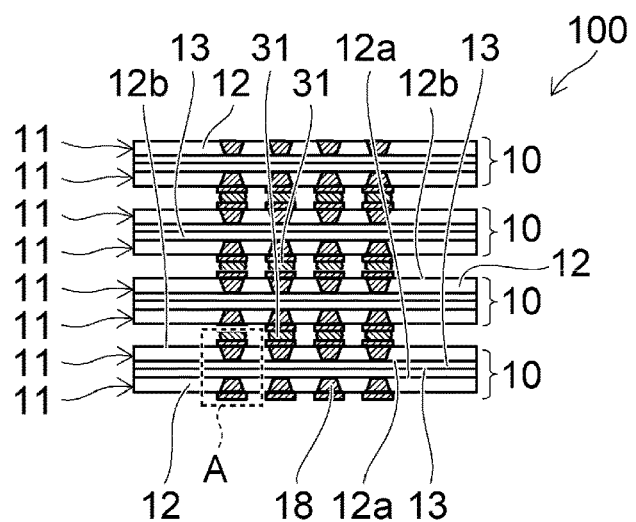
FIG. 10A is a schematic sectional view of a semiconductor element of the semiconductor device according to the embodiment.
Figure 10B:
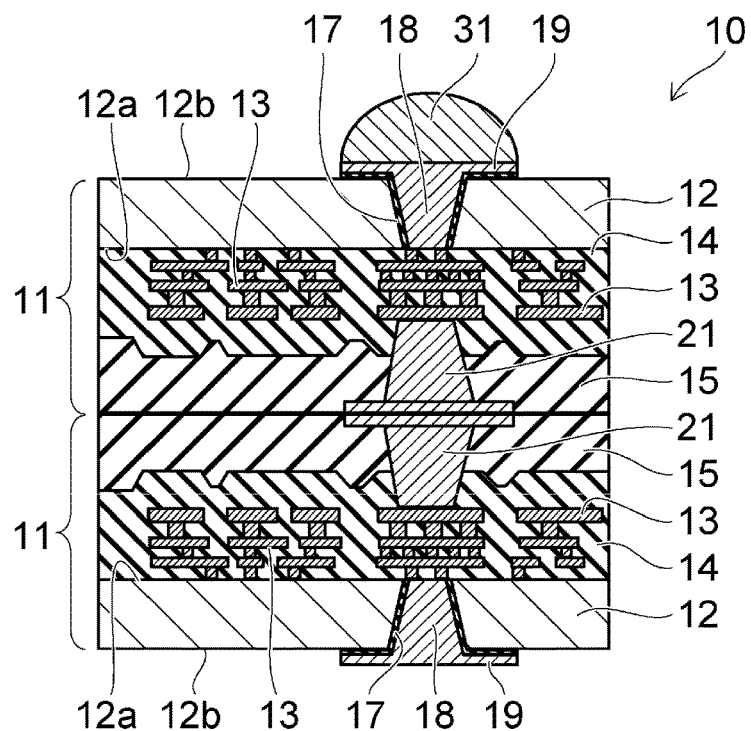
FIG. 10B is an enlarged schematic sectional view of a portion A in FIG. 10A.

FIG. 10A is a schematic sectional view of an example of the semiconductor element 100, and FIG. 10B is an enlarged schematic sectional view of a portion A in FIG. 10A.

The semiconductor element 100 includes a plurality of semiconductor chips (for example, memory chips) 11. Two semiconductor chips 11 are bonded to each other such that their circuit surfaces 12a face each other face-to-face, and thereby, one bonded chip 10 is formed. Then, a plurality of bonded chips 10 are stacked through bump connections.

As illustrated in FIG. 10B, each semiconductor chip 11 includes a semiconductor layer 12, wiring layers 13, a penetration electrode 18, and a bonding metal 21.

The semiconductor layer 12 is, for example, a silicon substrate or a silicon layer. The semiconductor layer 12 includes the circuit surface 12a and a rear surface 12b on a side opposite thereof to the circuit surface.

A semiconductor integrated circuit including transistors (not illustrated) and the like is formed on the circuit surface 12a. For example, in a case of a memory chip, a charge storage layer, a control electrode, and the like are formed on the circuit surface 12a.

The wiring layer 13 connected to the semiconductor integrated circuit and the control electrode is provided on the circuit surface 12a. Although multilayer wirings are illustrated in the figure, the wiring layer 13 may be a single layer. Interlayer insulation layers 14 are provided between the wiring layer 13 and the circuit surface 12a, between the wiring layers 13, and on the uppermost wiring layer 13.

The wiring layer 13 is a so-called on-chip wiring layer, and the conductor pattern 6 of the interposer 120 described above can be said to be a redistribution layer (RDL) with respect to the wiring layer (on-chip wiring layer) 13.

A resin layer 15 is provided on the interlayer insulation layer 14. Alternatively, the resin layer 15 may be omitted.

The penetration electrode 18 is provided on the semiconductor layer 12. A rear surface electrode 19 is provided on the rear surface 12b of the semiconductor layer 12. The penetration electrode 18 penetrates the semiconductor layer 12 at a location where the rear surface electrode 19 is formed and connects the rear surface electrode 19 to the wiring layer 13.

An insulation film 17 for preventing direct conduction between the penetration electrode 18 and the semiconductor layer 12 is provided between the penetration electrode 18 and the semiconductor layer 12.

A bonding metal 21 is buried in the resin layer 15. The bonding metal 21 penetrates a part of the resin layer 15 and the interlayer insulation layer 14, and is connected to the wiring layer 13. For example, a metal containing copper as a main component can be used for the bonding metal 21.

The two semiconductor chips 11 having the above-described structure are bonded to each other such that the circuit surface 12a (wiring layer 13) sides face each other, and thereby, one bonded chip 10 is formed. The bonding metals 21 of the semiconductor chips 11 are bonded to each other and the resin layers 15 are bonded (adhered) to each other.

In FIG. 10A, a bump (for example, solder bump) 31 is provided between the rear surface electrode 19 of the semiconductor chip 11 of one bonded chip 10 of the two bonded chips 10 which are adjacent and are vertically bonded and the rear surface electrode 19 of the semiconductor chip 11 of the other bonded chip 10. The bumps 31 connect the rear surface electrodes 19 of the semiconductor chips 11 to each other which are vertically arranged so as to face each other.

The semiconductor element 100 may be configured with one semiconductor chip. In addition, in the semiconductor element 100 having a structure in which a plurality of semiconductor chips are stacked, or a plurality of semiconductor chips may be wire-bonded to each other.

Figure 11:
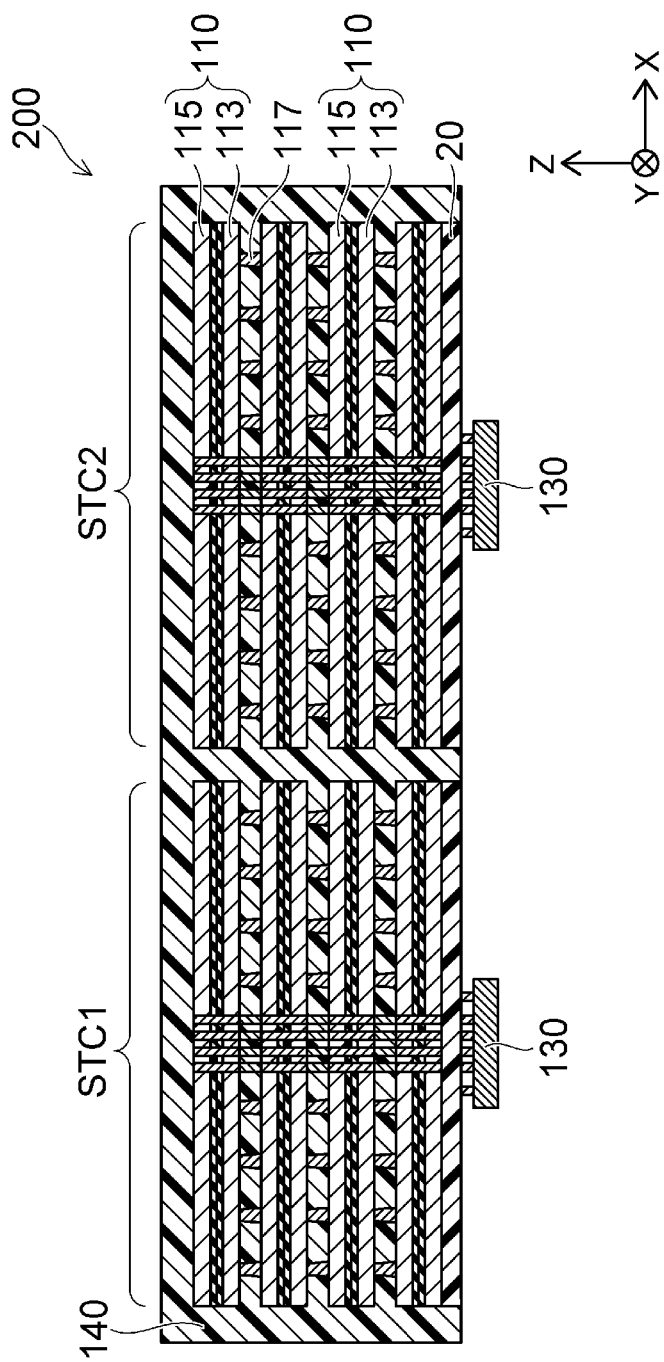
FIG. 11 is a schematic sectional view of the semiconductor element according to the embodiment.

FIG. 11 is a schematic sectional view of another example of the semiconductor element.

A semiconductor element 200 includes a stacked body STC1 and a stacked body STC2. Each of the stacked bodies STC1 and STC2 includes a plurality of the semiconductor chips 110.

The stacked bodies STC1 and STC2 are spaced from one another, for example, in the X direction on the mounting surface of the interposer described above. Each of the stacked bodies STC1 and STC2 includes the plurality of semiconductor chips 110 stacked one over the other in the Y direction.

The semiconductor chip 110 includes a first semiconductor layer 113 and a second semiconductor layer 115. Each of the first semiconductor layer 113 and the second semiconductor layer 115 has an element surface provided with a functional element and a rear surface opposite to the element surface. The first semiconductor layer 113 and the second semiconductor layer 115 are bonded to each other such that an element surface 113A of the second semiconductor layer 115 faces an element surface 113A of the first semiconductor layer 113 (see FIG. 12).

The semiconductor element 200 further includes a logic chip 130 electrically connected to the stacked bodies STC1 and STC2.

As illustrated in FIG. 11, the semiconductor chips 110 are stacked on the wiring board 20 via connection bumps (solder bumps) 117. The logic chip 130 is disposed on a rear surface side of the wiring board 20. The wiring board 20 has an upper surface having wires (not illustrated) connected to the semiconductor chip 110 and a rear surface on which the logic chip 130 is disposed.

The logic chip 130 is electrically connected to the stacked body STC1 or STC2 through via-contacts that penetrate, for example, the wiring board 20.

The stacked bodies STC1 and STC2 and the logic chip 130 are hermetically sealed with each other by, for example, a sealing resin 140.

By disposing the two stacked bodies STC1 and STC2 on the interposer, a yield rate of the stacked bodies STC1 and STC2 can be improved and a manufacturing yield of the semiconductor element 200 can increase.

For example, if the semiconductor element 200 is a semiconductor memory device, each of the semiconductor chips 110 is a memory chip, and each of the stacked bodies STC1 and STC2 functions as a memory stack in which a plurality of memory chips are stacked. The semiconductor element 200 has a total storage capacity that is the sum of a storage capacity of the stacked body STC1 and a storage capacity of the stacked body STC2. In the semiconductor element 200, a size of the memory chip can be halved compared with a case where the same memory capacity is provided by one memory stack.

A yield rate of the memory chip largely depends on the chip size. For example, among a plurality of memory chips formed on a silicon wafer, the memory chip having a structural defect therein becomes a defective chip, and the memory chip having no structural defect becomes a good chip. For example, the structural defects on the silicon wafer do not distribute uniformly and have a distribution depending on some factor. Accordingly, by reducing the chip size, the yield rate of memory chips can be further increased. As a result, the yield rate of the memory stack is remarkably increased by reducing a size of the memory chip.

Figure 12:
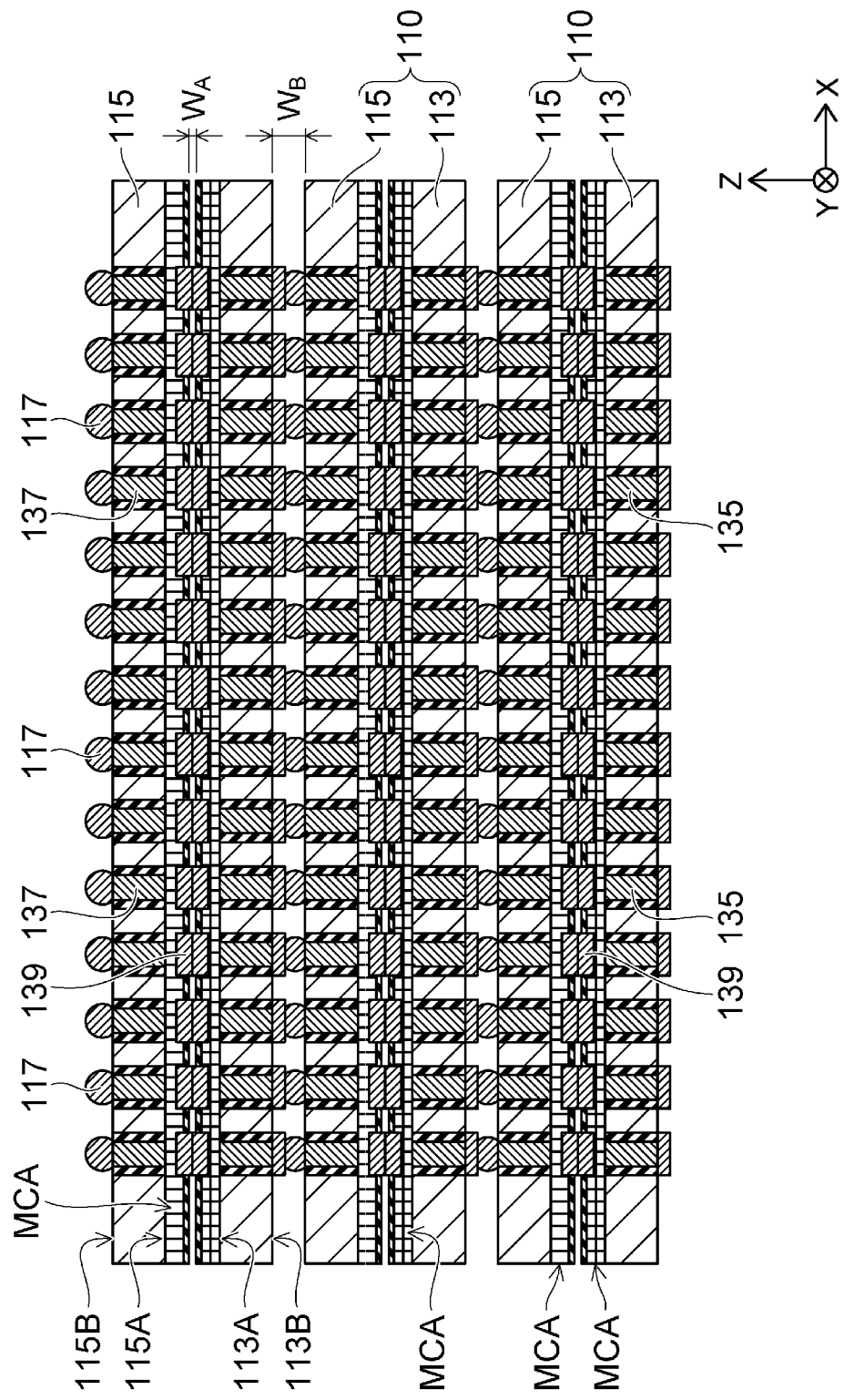
FIG. 12 is a schematic sectional view illustrating a stacked structure of semiconductor chips according to the embodiment.

FIG. 12 is a schematic sectional view illustrating a stacked structure of the semiconductor chip 110. As illustrated in FIG. 12, the semiconductor chip 110 has a structure in which the semiconductor layer 113 and the semiconductor layer 115 are bonded to each other. The semiconductor layers 113 and 115 are formed, for example, by grinding or polishing a semiconductor substrate to form a thin semiconductor layer.

The semiconductor layer 113 has an element surface 113A and a rear surface 113B, and the semiconductor layer 115 has an element surface 115A and a rear surface 115B. For example, memory cell arrays MCA including three-dimensionally arranged memory cells are respectively provided on the element surfaces 113A and 115A. In addition, via-contacts 135 extending from the rear surface 113B to the memory cell array MCA are provided in the semiconductor layer 113, and via-contacts 137 extending from the rear surface 115B to the memory cell array MCA are provided in the semiconductor layer 115. The via-contacts 135 and 137 are respectively connected to contact pads (not illustrated) of the memory cell array MCA.

The semiconductor layers 113 and 115 are bonded to each other such that the element surface 113A and the element surface 115A face each other. The semiconductor layers 113 and 115 are electrically connected to each other via contact pads 139 provided on the surface of the memory cell arrays MCA.

Furthermore, a plurality of the semiconductor chips 110 are stacked in the Z direction. The semiconductor chips 110 adjacent to each other in the Z direction are connected to each other by the connection bumps 117 connecting one via-contacts 135 to the other via-contacts 137.

For example, in the semiconductor chip 110, an interval $W_A$ between the memory cell array MCA provided on the element surface 113A and the memory cell array MCA provided on the element surface 115A is narrower than an interval $W_B$ between the rear surface 113B and the rear surface 115B of the semiconductor chips 110 adjacent thereto in the Z direction. If the memory cell array MCA on the element surface 113A and the memory cell array MCA on the element surface 115A are bonded so as to be in contact with each other, the interval $W_A$ becomes zero.

Figure 13:
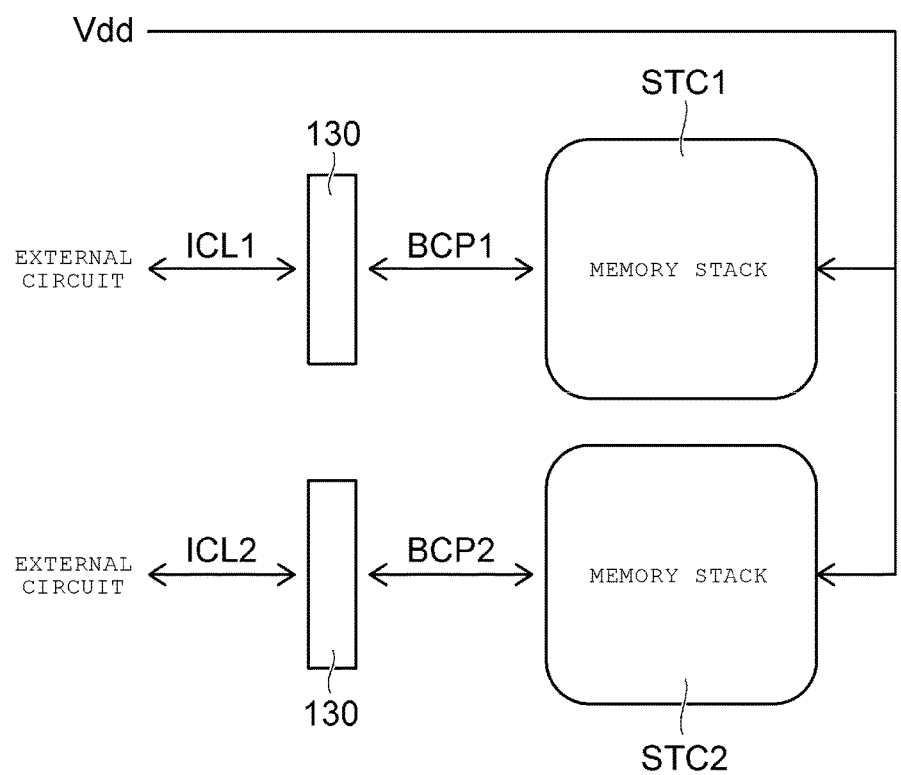
FIG. 13 is a schematic diagram illustrating a configuration of the semiconductor element according to the embodiment.

FIG. 13 is a schematic diagram illustrating a configuration of the semiconductor element 200.

The semiconductor element 200 is, for example, a semiconductor memory device and includes stacked bodies STC1 and STC2 functioning as a memory stack.

For example, a power supply voltage Vdd is supplied to the stacked bodies STC1 and STC2 via a common wire. Meanwhile, the stacked bodies STC1 and STC2 are connected to external circuits (not illustrated) via separate wires and the logic chips 130, respectively.

The stacked body STC1 is connected to the logic chip 130 via a connection conductor BCP1 and is connected to the external circuit via a wire ICL1. The connection conductor BCP1 includes, for example, the via-contact 135 of the semiconductor chip 110 located at the lowermost layer of the stacked body STC1 (see FIG. 12). In addition, the wire ICL1 includes, for example, a wire (not illustrated) formed on a surface of the wiring board 20.

The stacked body STC2 is connected to another logic chip 130 via a connection conductor BCP2 and is connected to the external circuit via a wire ICL2. The connection conductor BCP2 includes, for example, the via-contact 135 of the semiconductor chip 110 located at the lowermost layer of the stacked body STC2 (see FIG. 12). In addition, the wire ICL2 includes, for example, another wire (not illustrated) formed on the surface of the wiring board 20.

That is, the stacked bodies STC1 and STC2 are connected to the external circuits via independent paths, respectively. The configuration is valid if a signal bandwidth for transmitting and receiving data and commands between the external circuit and the logic chip 130 is narrower than a signal bandwidth in which the stacked bodies STC1 and STC2 can operate as an integrated memory stack.

Figure 14A:
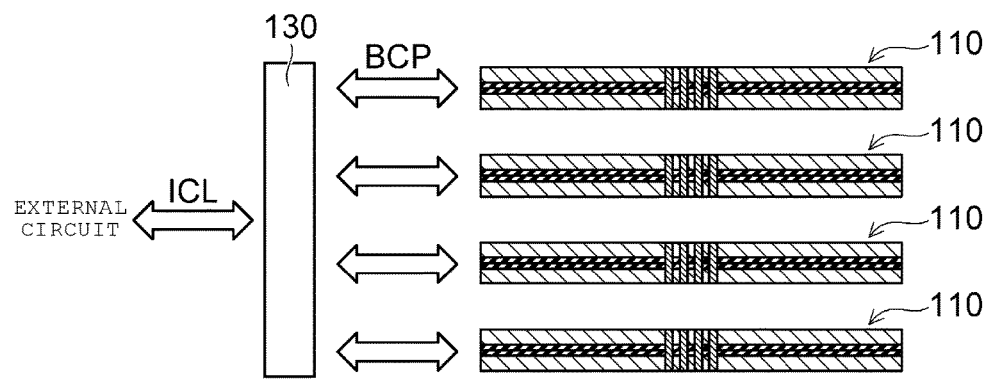
FIGS. 14A and 14B are schematic diagrams illustrating a connection between the semiconductor chip according to the embodiment and an external circuit.
Figure 14B:
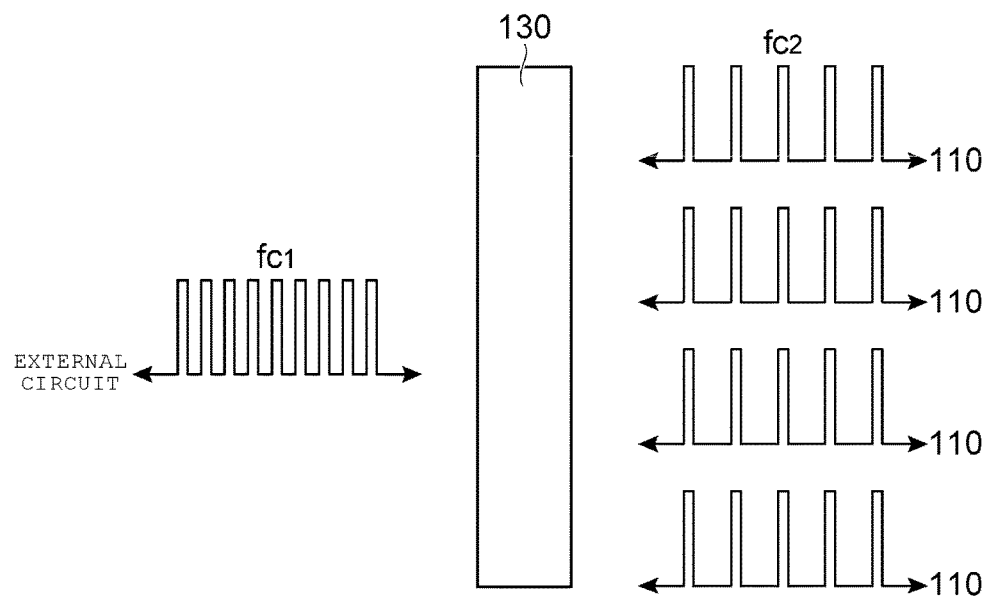

FIGS. 14A and 14B are schematic diagrams illustrating a method of connecting the semiconductor chip 110 to an external circuit via the logic chip 130. FIG. 14A is a schematic diagram illustrating a connection path between the semiconductor chip 110 and the external circuit. FIG. 14B is a schematic diagram illustrating signals transmitted and received between the semiconductor chip 110 and the external circuit.

As illustrated in FIG. 14A, the logic chip 130 and the external circuit are connected to each other by a wire ICL, and the logic chip 130 and each semiconductor chip 110 are connected to each other by different connection conductors BCP. The wire ICL is one of the wires ICL1 and ICL2 illustrated in FIG. 13.

The semiconductor chips 110 are connected in parallel to the logic chip 130. In this example, the logic chip 130 and the plurality of semiconductor chips 110 are connected via a plurality of connection conductors BCP. Each connection conductor BCP connects one semiconductor chip 110 to the logic chip 130.

The connection conductor BCP is a conductor extending into the stacked body STC1 or STC2 in the Z direction. The connection conductor BCP includes at least one of, for example, the connection bump 117, the via-contact 135, 137, and the contact pad 139 (see FIG. 12). In addition, the semiconductor chip 110 and the logic chip 130 may be electrically connected to each other via wires (not illustrated) provided on the connection conductor BCP and the wiring board 20 (see FIG. 11).

In this case, the logic chip 130 distributes commands and data transmitted from the external circuit to an interface circuit of the semiconductor chips 110, integrates data received from the respective semiconductor chips 110, and outputs the integrated data to the external circuit.

As illustrated in FIG. 14B, a frequency fc1 of a signal transmitted and received between the logic chip 130 and the external circuit is higher than a frequency fc2 of a signal transmitted and received between the logic chip 130 and each semiconductor chip. The logic chip 130 includes, for example, a buffer memory, and converts the frequency of the input/output signals.

Figure 15:
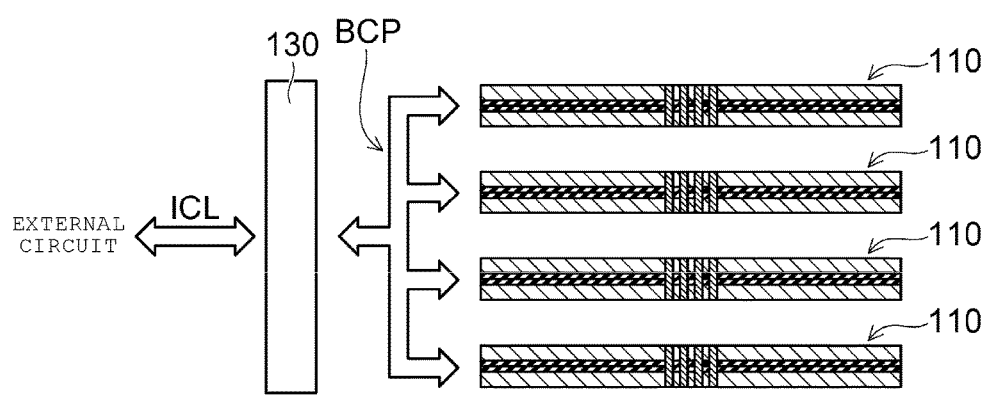
FIG. 15 is a schematic diagram illustrating a connection between the semiconductor chip according to the embodiment and the external circuit.

FIG. 15 is a schematic diagram illustrating another connection method between the semiconductor chip 110 and an external circuit. In this example, the logic chip 130 is connected to the plurality of semiconductor chips 110 through one connection conductor BCP.

For example, the logic chip 130 transmits and receives data to and from the plurality of semiconductor chips 110 stacked on the wiring board 20 through one connection conductor BCP. In addition, a plurality of the connection conductors BCP connected to two or more semiconductor chips 110 may be disposed between the logic chip 130 and the plurality of semiconductor chips 110.

Figure 16A:
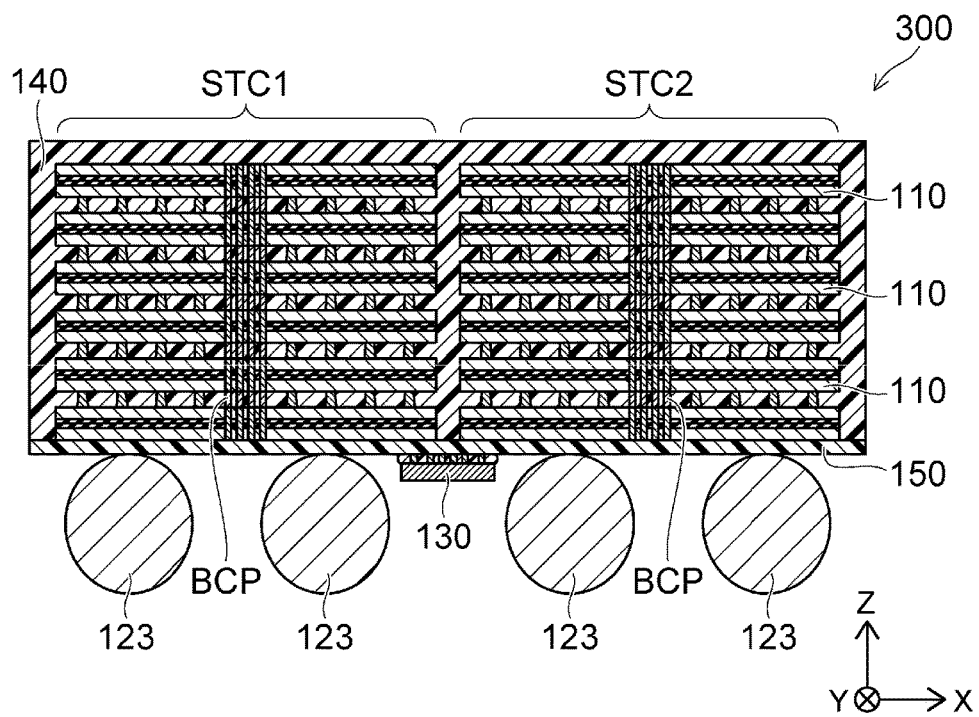
FIGS. 16A and 16B are schematic sectional views of the semiconductor element according to the embodiment.
Figure 16B:
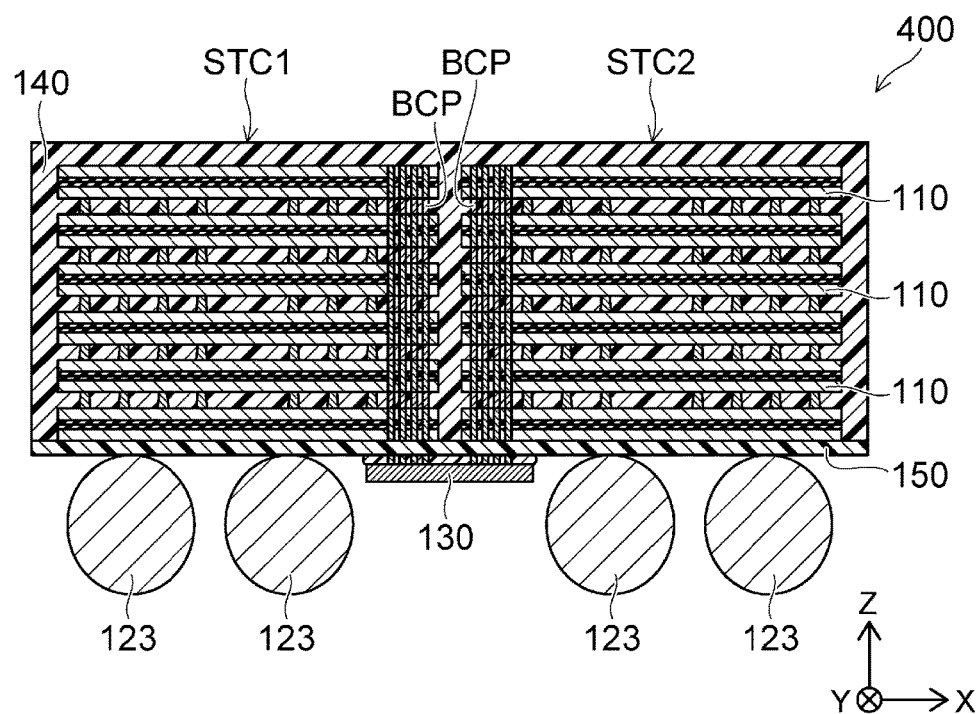
Figure 17:
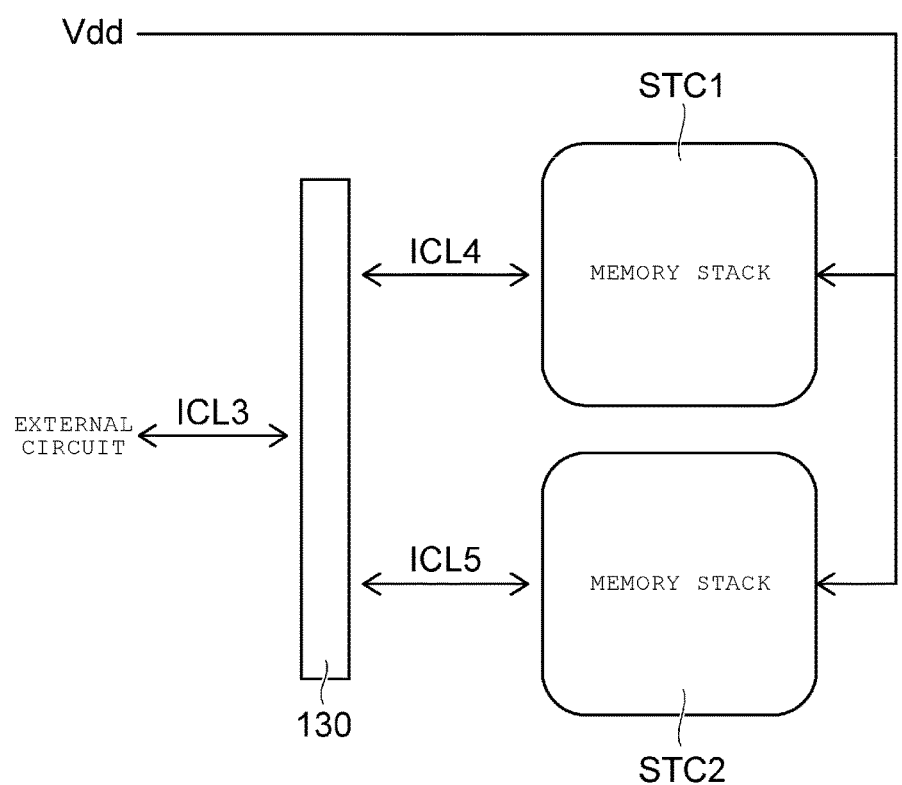
FIG. 17 is a schematic diagram illustrating a configuration of the semiconductor element according to the embodiment.

FIGS. 16A and 16B are schematic sectional views of still another example of the semiconductor element. FIG. 17 is a schematic diagram illustrating the configuration of the semiconductor element illustrated in FIGS. 16A and 16B.

Each of a semiconductor element 300 illustrated in FIG. 16A and a semiconductor element 400 illustrated in FIG. 16B includes the stacked body STC1, the stacked body STC2, the logic chip 130, and a wiring board 150. The stacked bodies STC1 and STC2 are disposed on an upper surface of the wiring board 150, and each stacked body includes a plurality of semiconductor chips 110. The logic chip 130 is disposed on a rear surface of the wiring board 150.

As illustrated in FIG. 16A, solder balls 123 and the logic chip 130 are disposed on the rear surface of the wiring board 150. The solder balls 123 and the logic chip 130 are connected to wires provided on an upper surface of the wiring board 150 through contact pads and via-contacts. The logic chip 130 is disposed so as to underlie both of the stacked bodies STC1 and STC2 when viewed in the Z direction.

Wires ICL3, ICL4, and ICL5 illustrated in FIG. 17 are provided on the upper surface of the wiring board 150. For example, an external circuit is connected to the wire ICL3 via the solder balls 123. Furthermore, the wire ICL 3 is connected to the logic chip 130. That is, the logic chip 130 transmits and receives signals to and from the external circuit through the wire ICL 3.

In addition, the stacked body STC1 transmits and receives signals to and from the logic chip 130 through the wire ICL4. The stacked body STC2 transmits and receives signals to and from the logic chip 130 through the wire ICL 5. The wires ICL4 and ICL5 are connected to the connection conductors BCP of the stacked bodies STC1 and STC2, respectively.

As illustrated in FIG. 16B, the connection conductors BCP of the stacked bodies STC1 and STC2 may be disposed above the logic chip 130. The logic chip 130 is disposed so as to underlie both of the stacked bodies STC1 and STC2 when viewed in the Z direction. The connection conductor BCP extends in the Z direction above the logic chip 130.

As such, by arranging the connection conductors BCP above the logic chip 130, lengths of wires are shortened, and thus, it is possible to increase a signal transmission speed between each semiconductor chip 110 and the logic chip 130.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    forming an insulation layer on a support body;
    selectively forming openings through the insulation layer;
    forming a conductor pattern in the openings, and above selected portions of, the insulation layer;
    mounting a first semiconductor element on the insulation layer and electrically connecting the first semiconductor element to the conductor pattern;
    forming a resin over the first semiconductor element and the insulation layer;
    after the resin is formed, removing the support body to expose a surface of a portion of the conductor pattern;
    etching the exposed surface of the portion of the conductor pattern to form a recess extending inwardly of a surface of the insulation layer over the portion of the conductor pattern; and
    forming a pad containing a metal different than the metal of the conductor pattern in the recess in contact with the conductor pattern.

2. The method according to claim 1, wherein the portion of the conductor pattern that is recessed comprises copper.

3. The method according to claim 1, wherein the forming of the pad comprises forming a film containing at least one of gold and nickel.

4. The method according to claim 3, wherein the forming of the pad comprises:
    forming a nickel film using electroless plating; and
    forming a gold film using electroless plating.

5. The method according to claim 4, wherein the nickel film is deposited over the conductor pattern; and
    the gold film is formed over the nickel film.

6. The method according to claim 5, further comprising:
    forming a palladium film on the nickel film before forming the gold film.

7. The method according to claim 3, wherein the forming of the pad comprises:
    forming a nickel film on the conductor pattern; and
    replacing nickel of the nickel film with gold.

8. The method according to claim 1, wherein a plurality of pads are provided and the pads are spaced from one another at a pitch of 40 µm or less.

9. The method according to claim 1, further comprising:
    bonding a second semiconductor element to the pad.

10. The method according to claim 9, wherein
    the first semiconductor element is a memory chip, and
    the second semiconductor element is a controller chip for the memory chip.

11. The method according to claim 1, wherein the support body comprises at least one of a silicon substrate or a glass substrate.

12. The method according to claim 1, wherein
    the conductor pattern is formed on a seed layer previously formed on the support body by a plating method, and
    the seed layer is removed to expose a surface of the portion of the conductor pattern after the support body is removed.

* * * * *